United States Patent
Azam et al.

(10) Patent No.: US 6,664,574 B2
(45) Date of Patent: Dec. 16, 2003

(54) HETEROJUNCTION SEMICONDUCTOR DEVICE AND METHOD OF MANUFACTURING

(75) Inventors: Misbahul Azam, Gilbert, AZ (US); Gary Loechelt, Tempe, AZ (US); Julio Costa, Phoenix, AZ (US)

(73) Assignee: Semiconductor Components Industries LLC, Phoenix, AZ (US)

( * ) Notice: Subject to any disclaimer, the term of this patent is extended or adjusted under 35 U.S.C. 154(b) by 0 days.

(21) Appl. No.: 09/945,683

(22) Filed: Sep. 5, 2001

(65) Prior Publication Data

US 2003/0042504 A1 Mar. 6, 2003

(51) Int. Cl.⁷ .................. H01L 31/0328; H01L 31/117
(52) U.S. Cl. .................. 257/197; 257/198; 257/616; 257/586
(58) Field of Search .................. 257/191, 192, 257/289, 329, 193, 263, 264, 265, 592, 584, 586, 590, 591, 197, 198, 616

(56) References Cited

U.S. PATENT DOCUMENTS 5,311,055 A * 5/1994 Goodman et al. .......... 257/584

* cited by examiner

*Primary Examiner*—Minh Loan Tran
*Assistant Examiner*—Tan Tran

(57) ABSTRACT

A semiconductor component (100) includes a semiconductor substrate (16) that is formed with trench (27). A semiconductor layer (20) is formed in the trench for coupling a control signal ($V_B$) through a sidewall (25) of the trench to route a current ($I_c$) through a bottom surface (23) of the trench.

17 Claims, 7 Drawing Sheets

HETEROJUNCTION SEMICONDUCTOR DEVICE AND METHOD OF MANUFACTURING

BACKGROUND OF THE INVENTION

The present invention relates in general to semiconductor devices and, more particularly, to a high-speed semiconductor device structure and a method of manufacturing the same.

In modern day electronic industries, high-speed data processing is very important. Circuits must respond to very high input data frequencies. Emitter coupled logic (ECL) gates are implemented with transistors that have a high-speed capability. However, as the input frequency is increased, the transistor's forward current gain decreases. The frequency at which the current gain decreases to one is called the unity gain frequency ($f_u$) or simply the "cut-off" frequency. Further increases in frequency reduce the current gain to less than unity, thereby reducing the performance of the logic gates.

The transistors in high-speed logic circuits should be designed to work at high frequencies as well as high current and power gains. One method of achieving high current and power gains at high frequencies is to shrink the base widths of the transistors and utilize heterojunction materials to form the transistors. For example, some transistors are formed using silicon-germanium (Si—Ge) or silicon-germanium-carbon (Si—Ge—C) in the base region while using silicon in the emitter region. Such transistors have brought significant improvements in the frequency response of the circuit due to the lower energy gap these materials have over transistors having both bases and emitters formed with silicon. Transistors formed using Si—Ge or Si—Ge—C are called Heterojunction Bipolar Transistors (HBT). HBTs often operate at a cut-off frequency of at least thirty GHz.

A problem with current HBT transistors is their high cost due to the complex processes needed to form the emitter-base heterojunction. The cost is further increased because of the expensive equipment needed to perform these processes and the large area of a manufacturing facility needed for the equipment. A further problem is that the quality of emitter-base region can be degraded if the transistor is subjected to many elevated temperature cycles typically employed to deposit and remove these films. Such elevated temperatures result in misfit dislocations that relax the strain in the crystal lattice structure. These misfits create current leakage paths and recombination centers that significantly decrease electrical performance of the transistor.

Hence, there is a need for a heterojunction transistor device and manufacturing method that lowers the manufacturing cost without degrading the transistor's electrical performance.

DETAILED DESCRIPTION OF THE DRAWINGS

In the figures, elements having the same reference number have similar functionality.

Figure 1:
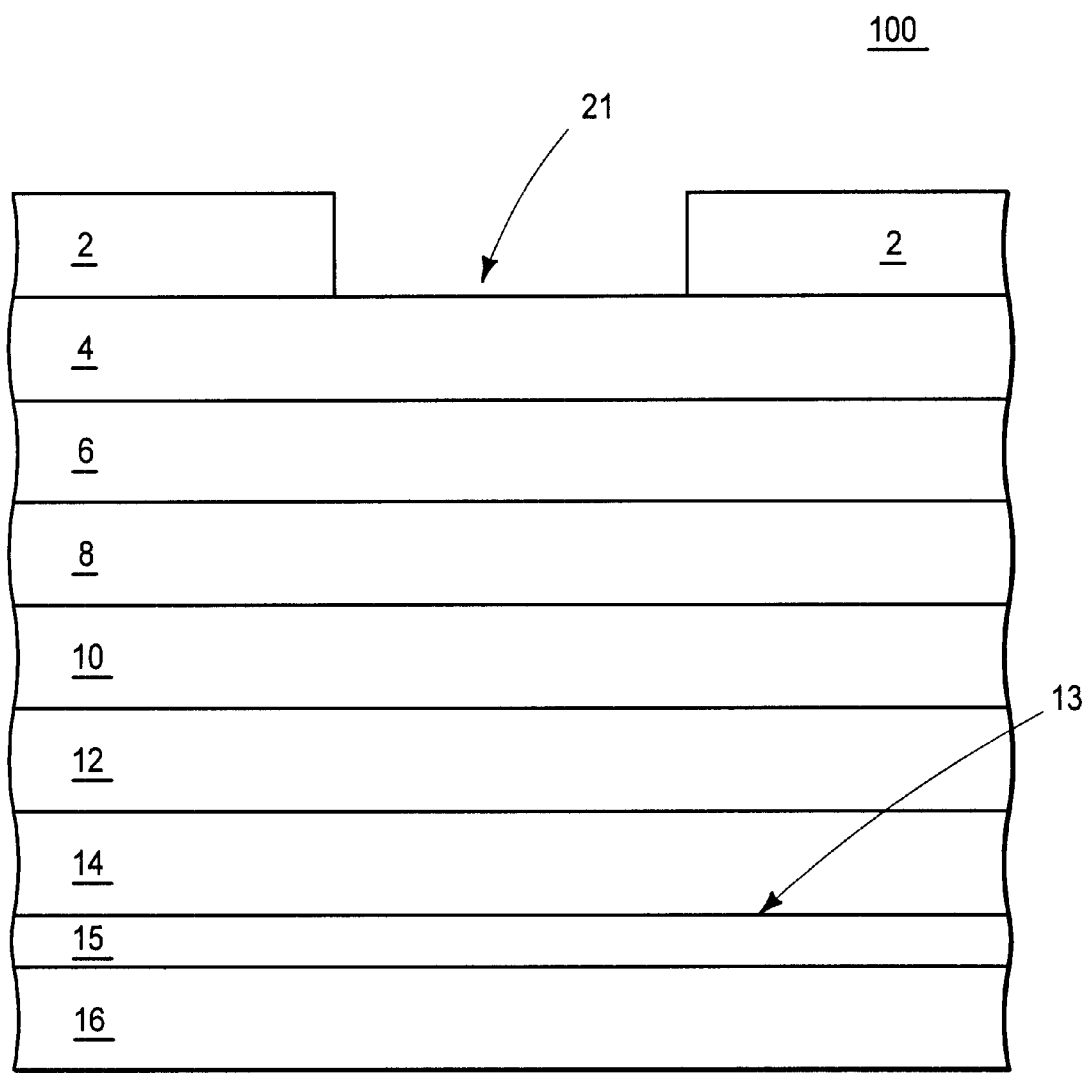
FIG. 1 is a cross-sectional view of a semiconductor component structure after a first processing step.

FIG. 1 is a cross-sectional view of a semiconductor component referred to as a heterojunction bipolar transistor (HBT) structure 100 after a first processing step. In one embodiment, HBT structure 100 is formed as part of an integrated circuit. In an alternate embodiment, HBT structure 100 is formed as a discrete device.

A substrate 16 is formed with a first semiconductor material having P+ conductivity and a high doping concentration to lower the resistivity of substrate 16 to approximately 0.09 to 0.11 ohm-centimeters (ohm-cm). In one embodiment, the first semiconductor material is monocrystalline silicon.

An epitaxial layer 15 is formed adjacent to substrate 16 with undoped silicon. Epitaxial layer 15 includes a heavily doped n-type buried layer formed adjacent to a surface 13. In one embodiment, the buried layer has high doping concentration of about $1.0 \times 10^{20}$ atoms per centimeter cubed ($cm^{-3}$) and a thickness of about 0.8 microns.

An epitaxial layer 14 is formed over epitaxial layer 15 to a thickness of about one micron. In one embodiment, epitaxial layer 14 is formed with monocrystalline silicon having an n-type conductivity and a doping concentration of approximately $2 \times 10^{16}$ atoms per centimeter cubed ($cm^{-3}$).

A dielectric layer 12 is formed with silicon dioxide over epitaxial layer 14 to a thickness of about sixty angstroms. A dielectric layer 10 is formed with silicon nitride over dielectric layer 12 to a thickness of about five-hundred angstroms.

A polysilicon layer 8 is formed over dielectric layer 10 to a thickness of approximately one thousand five hundred angstroms. In one embodiment, polysilicon layer 8 has a sheet resistance of about one hundred forty ohms per square centimeter.

A dielectric layer 6 is formed with silicon nitride to a thickness of about five hundred angstroms. An interlayer dielectric 4 is formed over dielectric layer 6 with tetra-ethyl-ortho-silicate (TEOS) approximately six thousand angstroms thick.

A photoresist layer 2 is a standard photoresist material formed over dielectric layer 4 and patterned to expose a portion of a surface 21 of dielectric layer 4 as shown.

Figure 2:
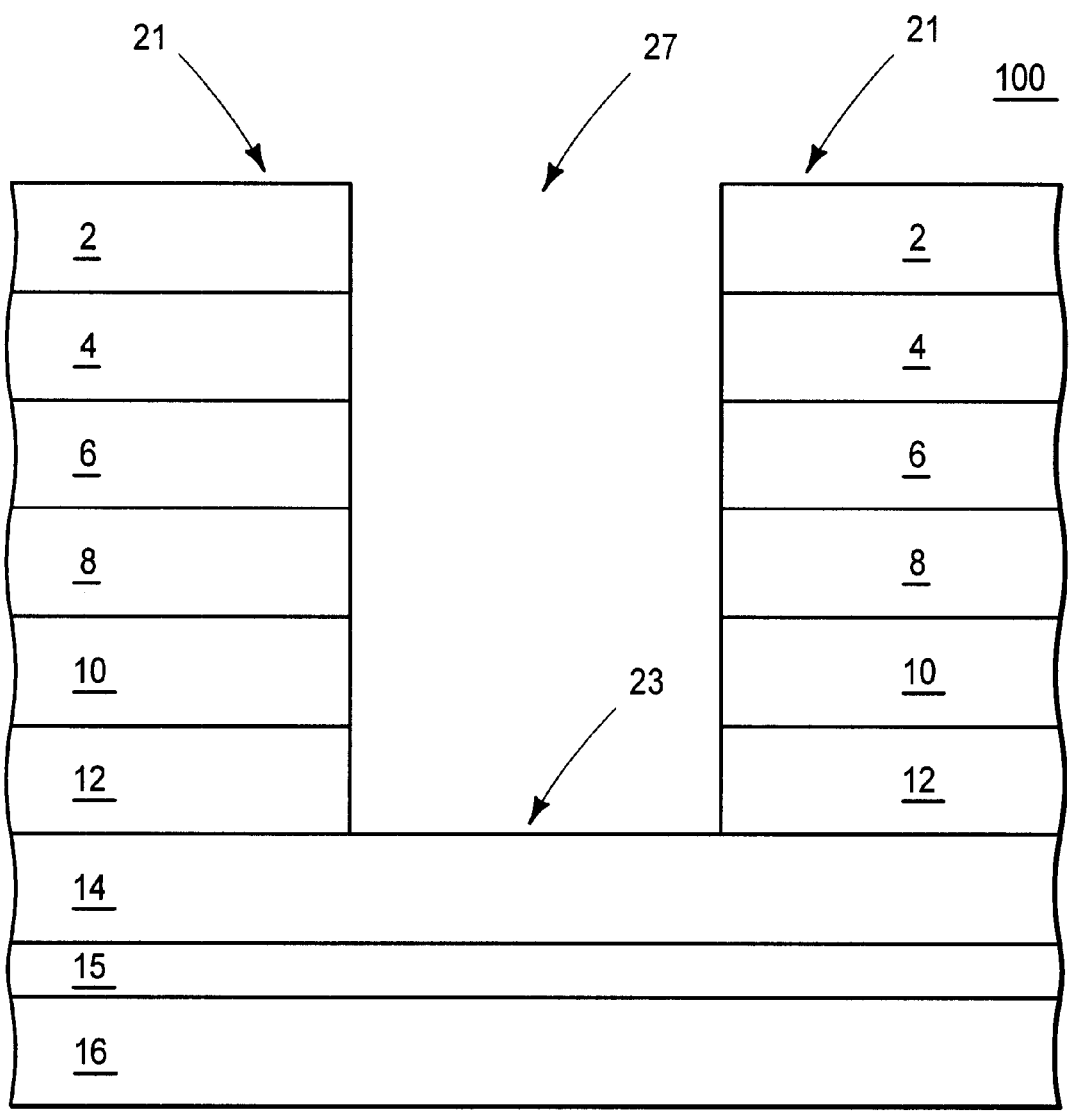
FIG. 2 is a cross-sectional view of a semiconductor component structure after a second processing step.

FIG. 2 is a cross-sectional view of HBT structure 100 after a second processing step. HBT structure 100 is subjected to a series of etching steps to remove material not covered by photoresist layer 2 to form a trench 27 that has a bottom surface 23 adjacent to epitaxial layer 14.

Figure 3:
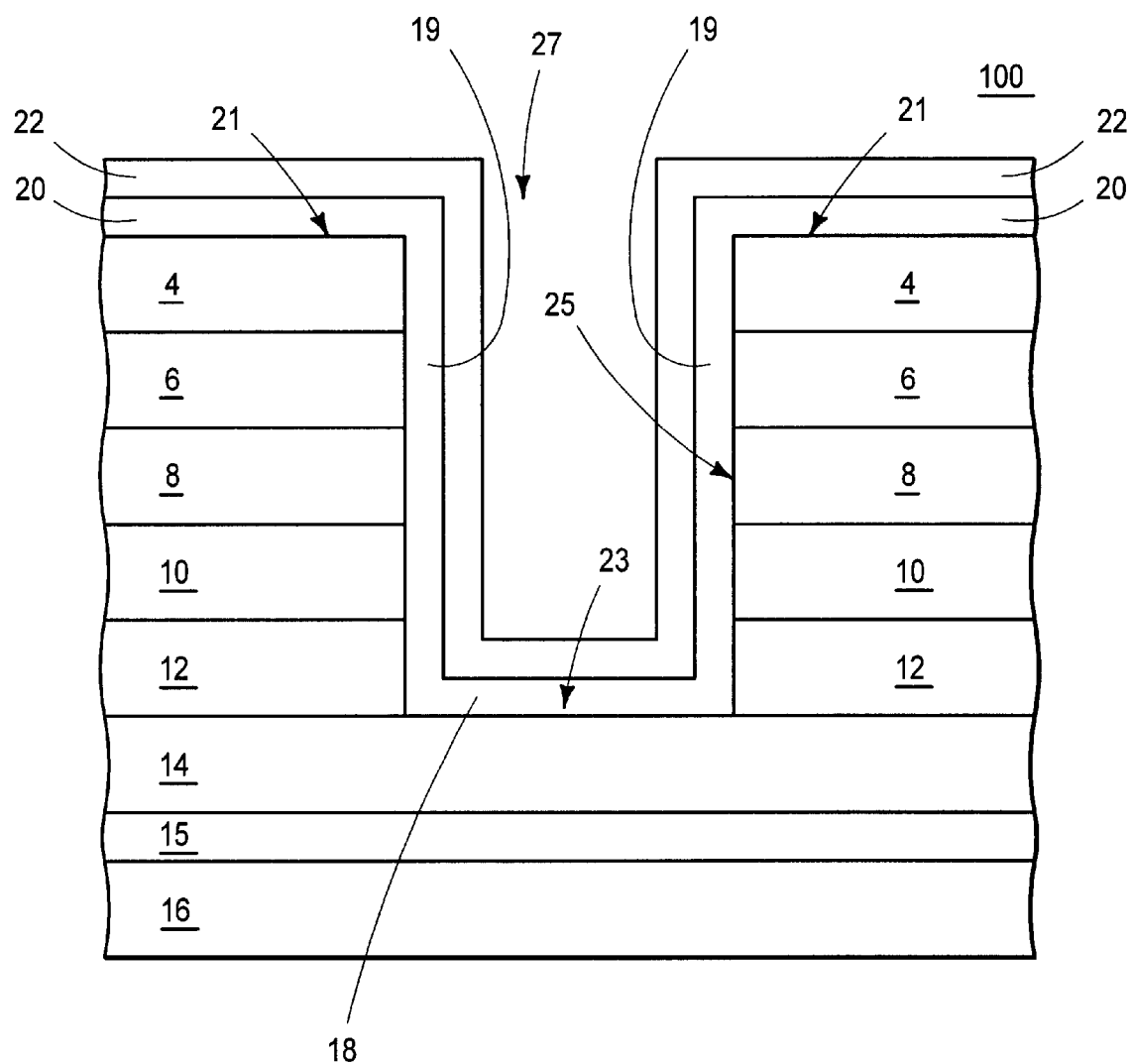
FIG. 3 is a cross-sectional view of a semiconductor component structure after a third processing step.

FIG. 3 is a cross-sectional view of HBT structure 100 after a third processing step. Photoresist layer 2 is removed using a standard removal process. A blanket heterojunction layer 20 is formed by depositing a second semiconductor material over surface 21, surface 23, and sidewalls 25 of trench 27. In one embodiment, heterojunction layer 20 is formed in using an epitaxial process to an overall thickness of about one thousand five hundred angstroms. In one embodiment, a first portion of heterojunction layer 20 is formed with Si—Ge or Si—Ge—C to a thickness of about one thousand one hundred angstroms adjacent to surface 23 and sidewalls 25. A second portion is formed with silicon to a thickness of about four hundred angstroms at a surface 69 of heterojunction layer 20. A standard epitaxial reactor may be programmed to produce the first and second portions of heterojunction layer 20 in a single processing step. Heterojunction layer has a p-type conductivity and a doping concentration of about $2\times10^{19}$ atoms per centimeter cubed ($cm^{-3}$)

As the second semiconductor material is deposited, heterojunction layer 20 is formed with different crystalline lattice structures in different regions, depending on the influence of the adjacent material. For example, region 18 of heterojunction layer 20, which lies along surface 23, has a predominantly monocrystalline lattice structure due to the influence of the adjacent monocrystalline structure of epitaxial layer 14. However, region 19 of heterojunction layer 20, has a predominantly polycrystalline structure due to the influence of adjacent dielectric and/or polycrystalline materials. For example, polysilicon layer 8 has a predominantly polycrystalline structure, so region 19 has a polycrystalline structure in the region adjacent to layer 8. Similarly, the influence of the amorphous crystalline structure of TEOS used to form dielectric layer 4 results in a polycrystalline structure in the adjacent portion of heterojunction layer 20.

A dielectric layer 22 is formed over heterojunction layer 20 as shown. In one embodiment, layer 22 comprises silicon dioxide formed to a thickness of approximately five hundred angstroms.

Figure 4:
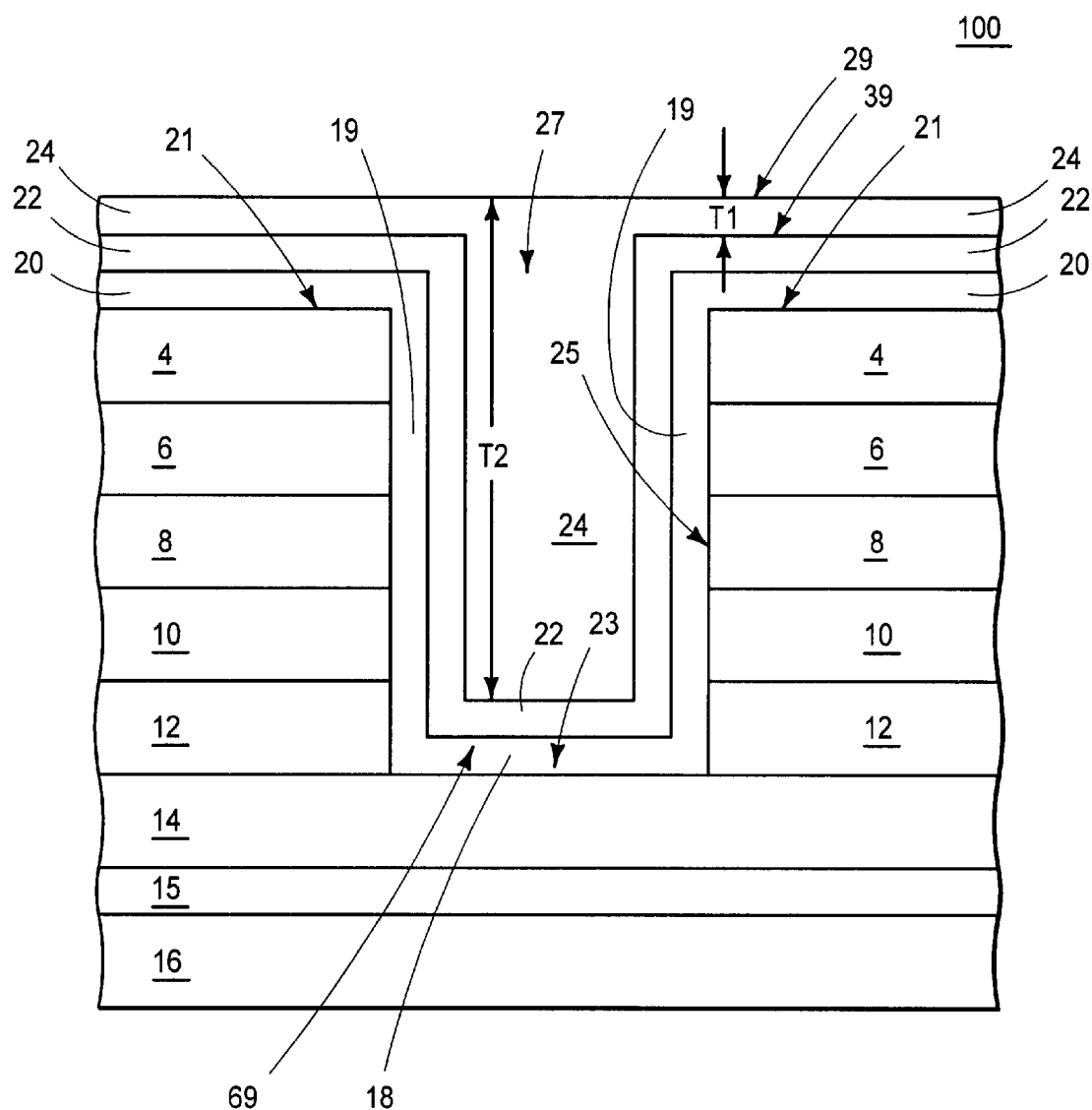
FIG. 4 is a cross-sectional view of a semiconductor component structure after a fourth processing step.

FIG. 4 is a cross-sectional view of HBT structure 100 after a fourth processing step. An organic film 24 is formed over dielectric layer 22 to have a planar surface 29 as shown. In one embodiment, organic film 24 is spun on to a thickness T1=1.0 micrometers in a region overlying surface 39 and to fill trench 27 to an overall greater thickness T2 in the region of trench 27. As a result, organic film is formed with a planar surface 29. Organic film 24 preferably comprises a standard photoresist material, which has the advantages of ready availability, low cost, good adhesion to the materials used to form integrated circuit films and good conformality when formed over a highly variable underlying topography. In addition, photoresist material has an advantage of low temperature application and removal, and therefore does not reduce the amount of thermal processing budgeted for other fabrication steps.

Figure 5:
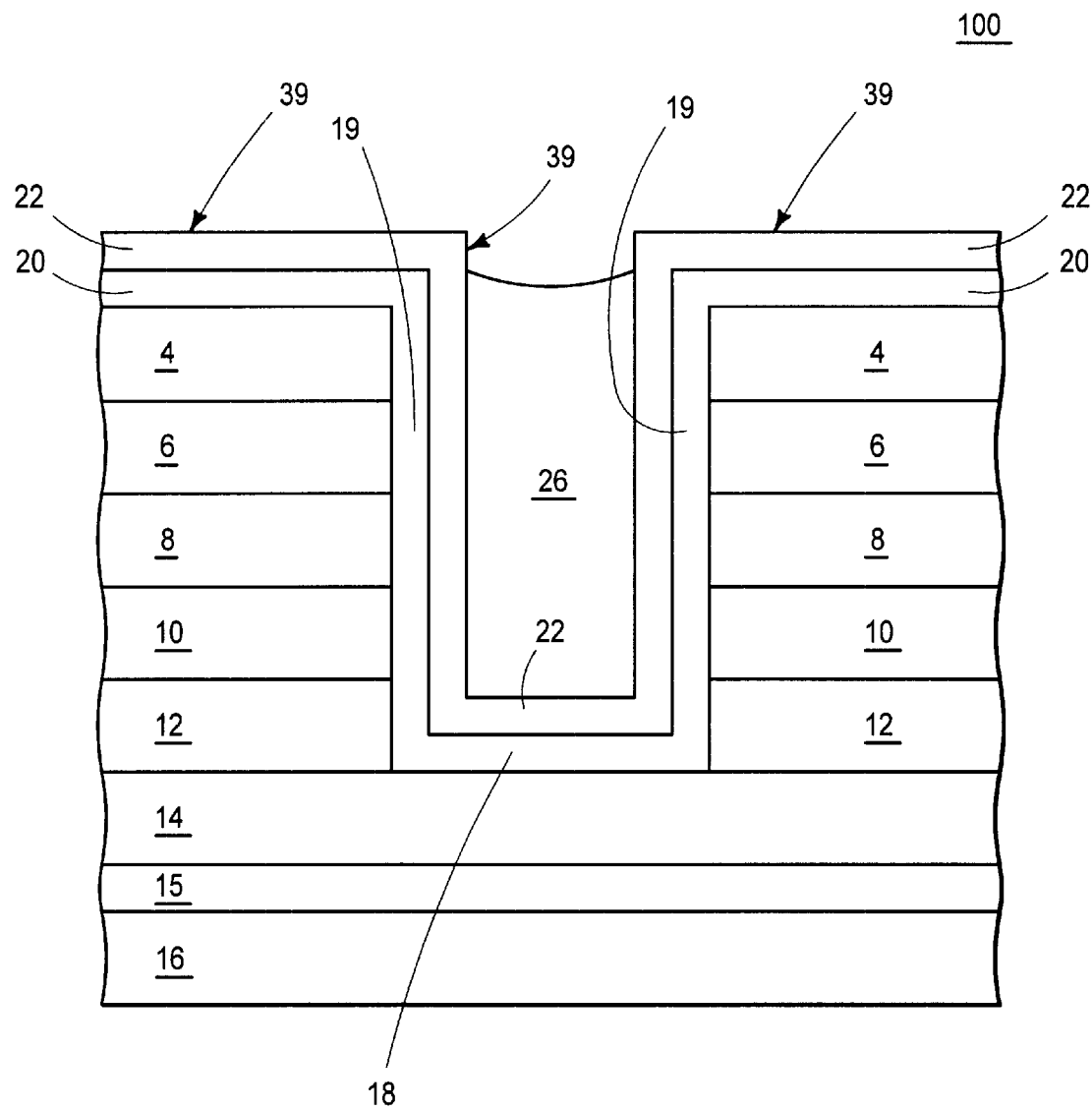
FIG. 5 is a cross-sectional view of a semiconductor component structure after a fifth processing step.

FIG. 5 is a cross-sectional view of HBT structure 100 after a fifth processing step. Organic film 24 is removed from surface 29 using a timed etch or ashing process to remove a fixed thickness of the organic material. A species detection method may be used to ensure that surface 39 is exposed while leaving a plug 26 of the organic material in trench 27. Note that plug 26 fills trench 27 to a height sufficient to cover the portion of polysilicon layer 8 adjacent to sidewall 25 as shown.

Figure 6:
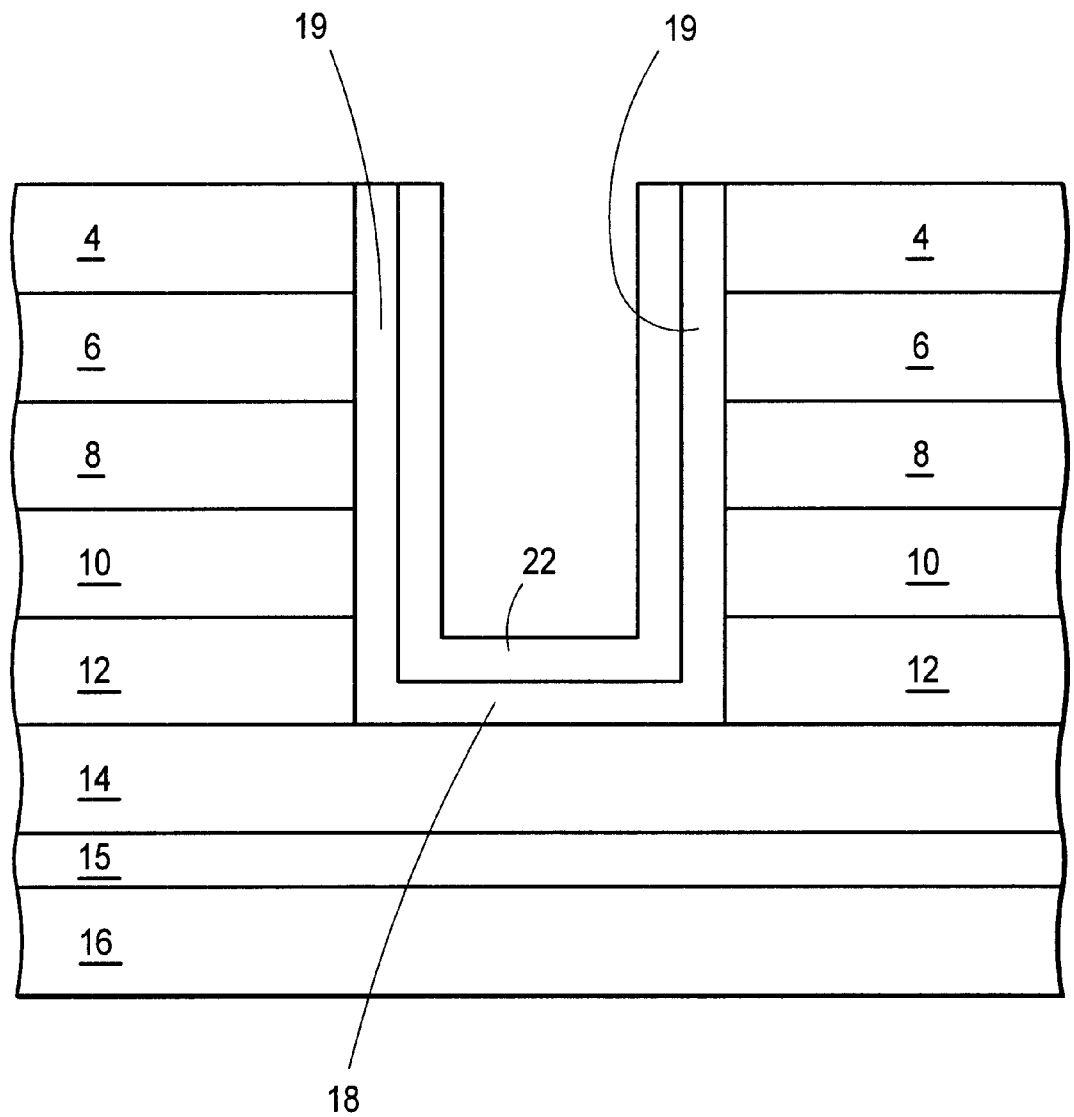
FIG. 6 is a cross-sectional view of a semiconductor component structure after a sixth processing step.

FIG. 6 is a cross-sectional view of HBT structure 100 after a sixth process step. Portions of dielectric layer 22 and heterojunction layer 20 are removed using a standard anisotropic etch process using plug 26 as a mask. Plug 26 is then removed and dielectric material deposited to extend dielectric layer 22 over exposed portions of heterojunction layer 20 to provide electrical isolation from subsequent layers. Note that the photoresist using this method effectively creates a self-aligned masking pattern without the use of traditional photomasking, exposure, and removal steps.

Figure 7:
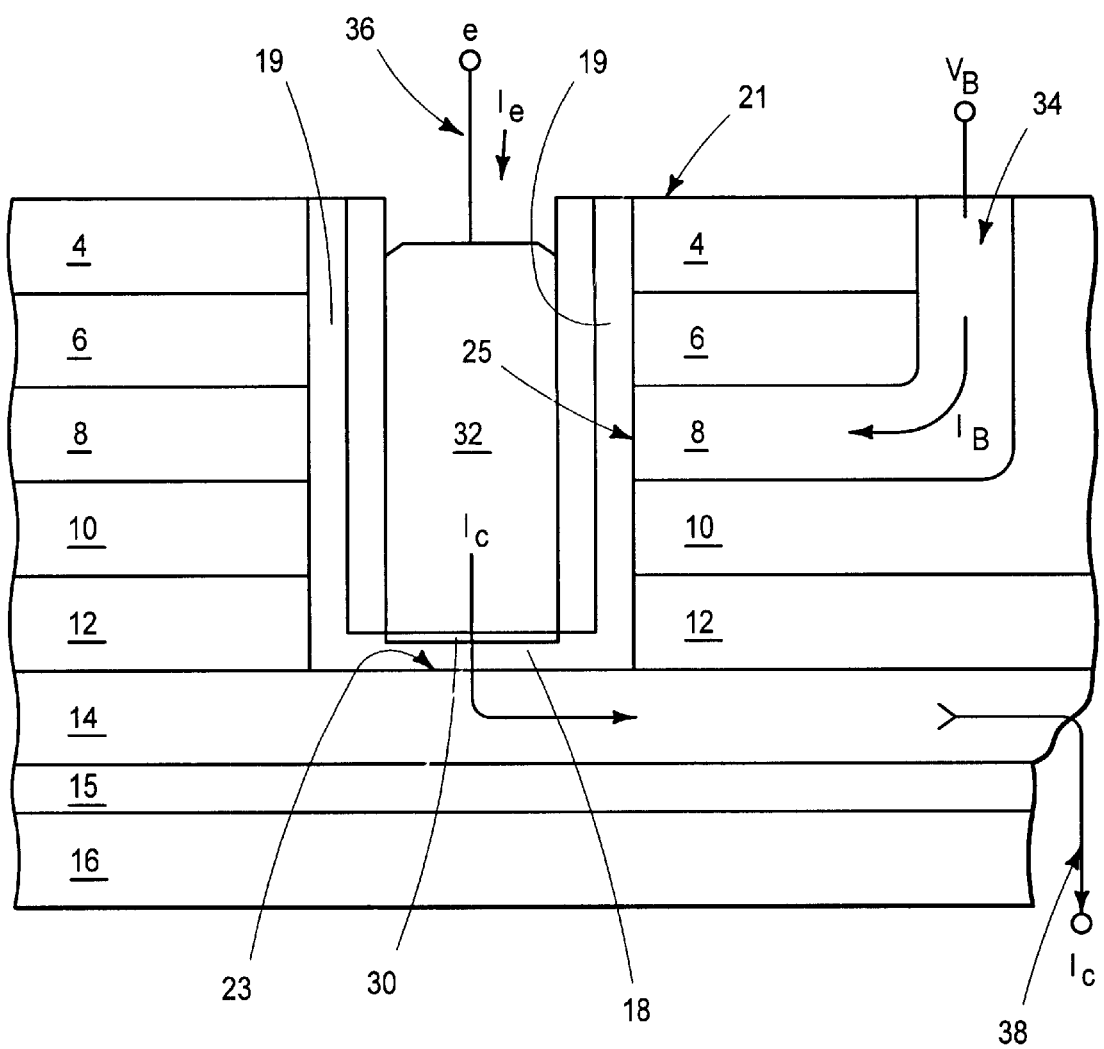
FIG. 7 is a simplified cross-sectional view of the semiconductor component structure.

FIG. 7 is a simplified cross-sectional view of HBT structure 100 after a seventh processing step. An anisotropic etch is applied to remove material from dielectric layer 22 to expose surface 69 of heterojunction layer 20. An emitter electrode 32 is formed in trench 27 with doped polysilicon using standard deposition and patterning processes. In one embodiment, emitter electrode 32 has an n-type conductivity and a doping concentration of about $5\times10^{20}$ atoms per centimeter cubed ($cm^{-3}$). N-type dopants diffuse from emitter electrode 32 through surface 69 and into the adjacent portion of heterojunction layer 20 to form a heavily doped emitter region 30. Emitter region 30 extends to a depth less than four hundred angstroms from surface 69. Hence, emitter region 30 comprises doped monocrystalline silicon.

Regions 18 and 19 of heterojunction layer 20 combine with an adjacent portion of polysilicon layer 8 to function as a base electrode of HBT structure 100. A conductive region 34 is formed as shown for coupling a control signal $V_B$ to the base electrode as shown.

Epitaxial regions 14 and 15 function as a collector 38 of HBT structure 100. In an integrated circuit embodiment, collector 38 comprises an n-type diffusion extending from surface 21 to provide electrical contact to epitaxial regions 14–15. Alternatively, such as where HBT structure 100 is a discrete device, collector 38 extends from epitaxial regions 14–15 to the bottom surface (not shown) of substrate 16.

In operation, a current $I_e$ is supplied to emitter electrode 32. HBT structure 100 turns on when a forward bias control signal VB is applied to conductive region 34 and routed through polysilicon layer 8 and through sidewall 25 to regions 18–19 of heterojunction layer 20. Current IC flows through emitter electrode 32, emitter region 30, region 18 of layer 20 and across bottom surface 23 of trench 27 to epitaxial layers 14–15 and collector 38. Thus the emitter current is approximately the sum of the collector current and the base current.

In summary, the present invention provides a high speed heterojunction bipolar transistor having fewer processing steps and therefore a lower fabrication cost than previous devices. A semiconductor substrate is formed with a first semiconductor material to form a trench formed on a top surface. A semiconductor layer is formed in the trench from a second semiconductor material to couple a control signal through a sidewall of the trench to control a current that flows through a bottom surface of the trench. A semiconductor layer is coated with an organic material to a first thickness in a first region and to a second thickness greater than the first thickness in a second region of the semiconductor layer. Then a predetermined thickness of the organic material is removed to produce an organic plug in the second region for use as a method to pattern an electrode of the semiconductor component.

What is claimed is:

1. A semiconductor component, comprising:
    a semiconductor substrate formed with a first semiconductor material to define a trench; and
    a semiconductor layer formed in the trench with a second semiconductor material for coupling a control signal through a sidewall of the trench to route a current through a bottom surface of the trench, wherein the semiconductor layer has a substantially polycrystalline structure along the sidewall and a substantially monocrystalline structure along the bottom surface of the trench.

2. The semiconductor component of claim 1, wherein the semiconductor component is formed as a heterojunction bipolar transistor.

3. The semiconductor component of claim 2, wherein the first semiconductor material comprises silicon.

4. The semiconductor component of claim 3, wherein the second semiconductor material is selected from the group consisting of silicon-germanium and silicon-germanium-carbon.

5. The semiconductor component of claim 1, further comprising a control electrode formed in the semiconductor substrate for coupling the control signal to the sidewall.

6. The semiconductor component of claim 5, further comprising a first conduction electrode formed in a monocrystalline region of the semiconductor layer for conducting the current.

7. The semiconductor component of claim 6, further comprising a second conduction electrode disposed for receiving the current from the bottom surface of the trench.

8. The semiconductor component of claim 7, wherein the semiconductor component includes a bipolar transistor, the control electrode functions as a base, and the first and second conduction electrodes respectively function as an emitter and a collector of the bipolar transistor.

9. A semiconductor device comprising:

a substrate formed with a first semiconductor material and having a recessed region;

a first layer formed with a second semiconductor material along a sidewall and a bottom surface of the recessed region;

a control electrode electrically coupled to the first layer through the sidewall of the recessed region to control a current of the semiconductor device through the bottom surface of the recessed region; and an emitter region made of the first semiconductor material and forming a first junction with the first layer.

10. The semiconductor device of claim 9, further comprising a epitaxial layer formed on the substrate.

11. The semiconductor device of claim 10, wherein the first layer has a first lattice structure along the sidewall of the recessed region and a second lattice structure on the bottom of the recessed region.

12. A semiconductor device, comprising:

a semiconductor substrate formed with a trench;

a first layer formed in the trench and having a first region with a monocrystalline structure and a second region with a crystalline structure different from the monocrystalline structure;

a second layer formed on the substrate adjacent to the second region of the first layer for controlling a current that flows through the first region to a bottom surface of the trench.

13. The semiconductor device of claim 12 wherein the substrate is formed of a first semiconductor material and the first layer is formed of a second semiconductor material.

14. The semiconductor device of claim 13 wherein the first semiconductor material includes silicon.

15. The semiconductor device of claim 13 wherein the first layer is selected from the group consisting of silicon-germanium and silicon-germanium-carbon.

16. The semiconductor device of claim 15 wherein the monocrystalline structure is formed along the bottom surface of the trench and the crystalline structure different from the monocrystalline structure along a sidewall of the trench.

17. The semiconductor device of claim 16 wherein the crystalline structure different from the monocrystalline structure along a sidewall of the trench includes polycrystalline structure.

* * * * *